(12) United States Patent
Lee et al.

(10) Patent No.: US 8,048,743 B2
(45) Date of Patent: Nov. 1, 2011

(54) METHOD FOR FABRICATING VERTICAL CHANNEL TYPE NONVOLATILE MEMORY DEVICE

(75) Inventors: Ki-Hong Lee, Gyeonggi-do (KR); Moon-Sig Joo, Gyeonggi-do (KR); Kwon Hong, Gyeonggi-do (KR); Sun-Hwan Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/493,439

(22) Filed: Jun. 29, 2009

(65) Prior Publication Data
US 2010/0317166 A1    Dec. 16, 2010

(30) Foreign Application Priority Data
Jun. 12, 2009  (KR) .................. 10-2009-0052159

(51) Int. Cl.
H01L 21/336    (2006.01)
(52) U.S. Cl. ........ 438/270; 438/268; 438/269; 257/296; 257/302
(58) Field of Classification Search ............ 257/204, 257/319, 324, 326, 296, 302; 438/163, 386, 438/458, 270
See application file for complete search history.

(56) References Cited

U.S. PATENT DOCUMENTS

| | | | | | |
|---|---|---|---|---|---|
| 4,977,104 | A | * | 12/1990 | Sawada et al. | 438/386 |
| 2004/0229415 | A1 | * | 11/2004 | Takehashi et al. | 438/163 |
| 2009/0184360 | A1 | * | 7/2009 | Jin et al. | 257/319 |

FOREIGN PATENT DOCUMENTS

| | | |
|---|---|---|
| JP | 54008981 A * | 1/1979 |
| JP | 2008-192708 | 8/2008 |
| KR | 1020070046350 | 5/2007 |
| KR | 102007006991 | 7/2007 |

OTHER PUBLICATIONS

Notice of Preliminary Rejection issued from Korean Intellectual Property Office on Apr. 12, 2011.

* cited by examiner

*Primary Examiner* — Thanh V Pham
*Assistant Examiner* — Errol Fernandes
(74) *Attorney, Agent, or Firm* — IP & T Group LLP (57) ABSTRACT

A method for fabricating a vertical channel type nonvolatile memory device includes: stacking a plurality of interlayer insulating layers and a plurality of gate electrode conductive layers alternately over a substrate; etching the interlayer insulating layers and the gate electrode conductive layers to form a channel trench exposing the substrate; forming an undoped first channel layer over the resulting structure including the channel trench; doping the first channel layer with impurities through a plasma doping process; and filling the channel trench with a second channel layer.

16 Claims, 7 Drawing Sheets

METHOD FOR FABRICATING VERTICAL CHANNEL TYPE NONVOLATILE MEMORY DEVICE

CROSS-REFERENCE TO RELATED APPLICATIONS

The present application claims priority of Korean Patent Application No. 10-2009-0052159, filed on Jun. 12, 2009, the disclosure of which is incorporated herein by reference in its entirety.

BACKGROUND OF THE INVENTION

The present invention relates to a method for fabricating a nonvolatile memory device, and more particularly, to a method for fabricating a three-dimensional (3D) nonvolatile memory device.

Nonvolatile memory devices retain stored data even when power is interrupted. However, two-dimensional (2D) memory devices fabricated in a single layer on a silicon substrate have limitations in improving integration density. Therefore, 3D nonvolatile memory devices with memory cells stacked vertically from a silicon substrate are desirable.

Hereinafter, the structure and limitation of a conventional 3D nonvolatile memory device will be described in detail with reference to FIG. 1.

Figure 1:
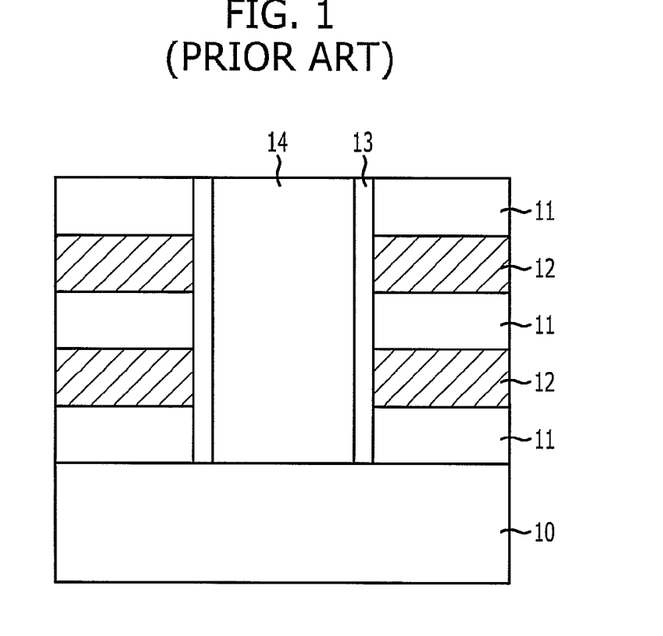
FIG. 1 is a cross-sectional view of a conventional 3D nonvolatile memory device.

FIG. 1 is a cross-sectional view of a conventional 3D nonvolatile memory device. Specifically, FIG. 1 is a cross-sectional view of a nonvolatile memory device in which strings are vertically arranged over a substrate. For the sake of convenience, a description about a process of forming a lower selection transistor and an upper selection transistor is omitted.

Referring to FIG. 1, a plurality of interlayer insulating layers 11 and a plurality of gate electrode conductive layers 12 are alternately formed on a substrate 10 having required lower structures such as source lines and lower select transistors that are formed, for example, below the interlayer insulating layers 11 and the plurality of gate electrode conductive layers 12. Thereafter, the interlayer insulating layers 11 and the gate electrode conductive layers 12 are selectively etched to form a channel trench exposing the surface of the substrate 10.

A charge blocking layer, a charge trapping layer, and a tunnel insulating layer are sequentially formed over the resulting structure including the channel trench. Thereafter, an etch-back process is performed to expose the surface of the substrate 10. For illustration purposes, the charge blocking layer, the charge trapping layer, and the tunnel insulating layer are shown as one layer denoted by a reference numeral 13.

The channel trench is filled with a channel layer to form a channel 14 protruding vertically from the substrate 10. Herein, the channel layer may be formed by growing a monocrystalline silicon layer through an epitaxial growth process, or may be formed by depositing a polysilicon layer through a chemical vapor deposition (CVD) process.

Consequently, a plurality of stacked memory cells are formed along the channel 14 protruding vertically from the substrate 10, and the memory cells are connected in series between a lower select transistor (not shown) and an upper select transistor (not shown) to constitute one string.

However, the foregoing conventional method has limitations in controlling the doping concentration of the channel 14.

In general, for fabrication of a nonvolatile memory device, the doping concentration of the channel 14 is controlled to control the threshold voltage of the memory cells. For example, the threshold voltage is controlled by doping the channel layer with n-type impurities at a low concentration. In the case of a conventional planar nonvolatile memory device, a channel layer is formed and the channel layer is doped with impurities through an ion implantation process, thereby forming a channel with a low doping concentration.

However, in the case of the vertical channel type nonvolatile memory device, because the channel trench is filled with the channel layer to form the channel 14, doping by ion implantation is difficult to implement. Also, even when the channel layer is formed through a doping process, it is not easy to implement a doping concentration of less than $1E19$ atoms/cm$^3$. That is, according to the conventional method, it is impossible to form a vertical channel with a low doping concentration for fabrication of a 3D nonvolatile memory device.

For illustration purposes, limitations that occur in forming a channel of a memory cell have been explained. However, such limitations may also occur in forming a lower select transistor or an upper select transistor.

SUMMARY OF THE INVENTION

An embodiment of the present invention is directed to provide a method for fabricating a 3D nonvolatile memory device, which can easily control the doping concentration of a channel.

In accordance with an aspect of the present invention, there is provided a method for fabricating a vertical channel type nonvolatile memory device, the method including: stacking a plurality of interlayer insulating layers and a plurality of gate electrode conductive layers alternately over a substrate; etching the interlayer insulating layers and the gate electrode conductive layers to form a channel trench exposing the substrate; forming an undoped first channel layer over the resulting structure including the channel trench; doping the first channel layer with impurities through a plasma doping process; and filling the channel trench with a second channel layer.

In accordance with another aspect of the present invention, there is provided a method for fabricating a vertical channel type nonvolatile memory device, the method including: stacking a plurality of interlayer insulating layers and a plurality of gate electrode conductive layers alternately over a substrate; etching the interlayer insulating layers and the gate electrode conductive layers to form a channel trench exposing the substrate; and alternately forming first and second channel layers with different doping concentrations in the channel trench.

DESCRIPTION OF SPECIFIC EMBODIMENTS

Other objects and advantages of the present invention can be understood by the following description, and become apparent with reference to the embodiments of the present invention.

Referring to the drawings, the illustrated thickness of layers and regions are exemplary and may not be exact. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals represent the same or like components, even if they appear in different embodiments or drawings of the present invention.

Figure 2A:
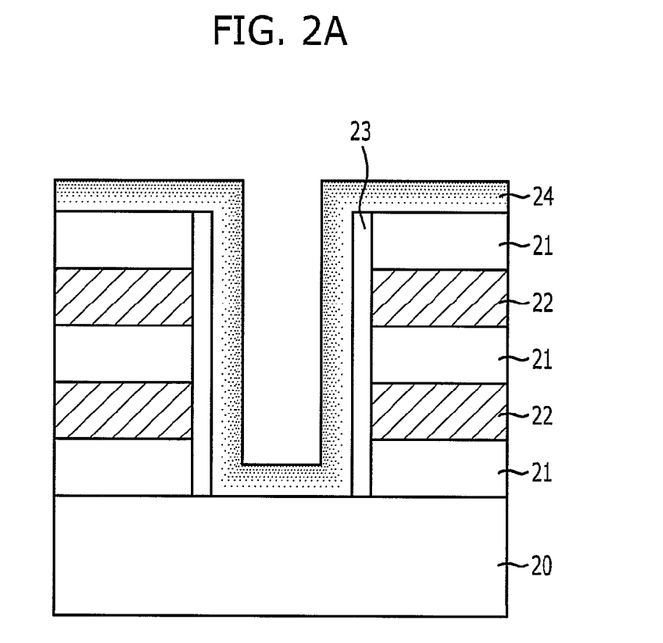
FIGS. 2A to 2C are cross-sectional views illustrating a process for fabricating a 3D nonvolatile memory device in accordance with an embodiment of the present invention.
Figure 2B:
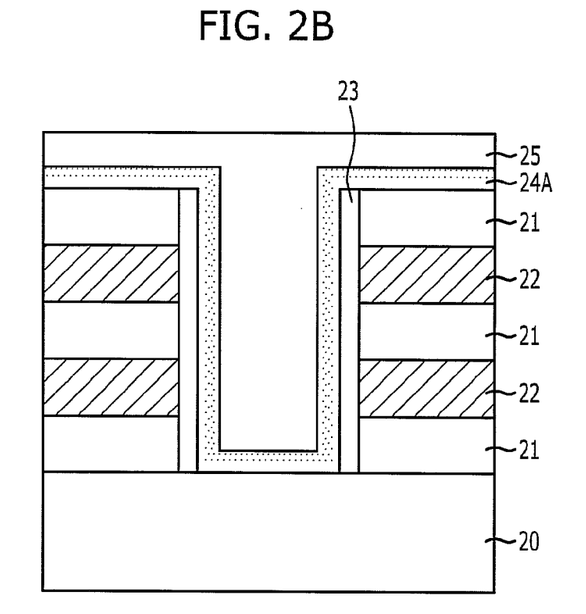
Figure 2C:
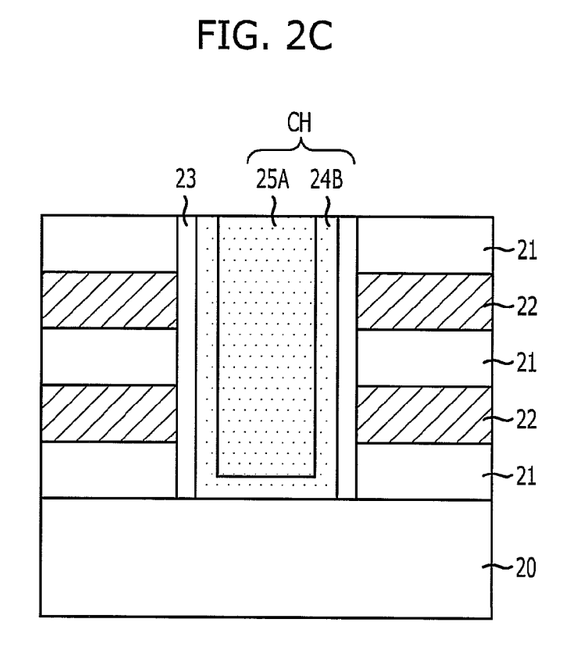

FIGS. 2A to 2C are cross-sectional views illustrating a process for fabricating a 3D nonvolatile memory device in accordance with an embodiment of the present invention.

Referring to FIG. 2A, a plurality of interlayer insulating layers 21 and a plurality of gate electrode conductive layers 22 are alternately formed on a substrate 20.

Herein, the interlayer insulating layers 21 serve to isolate a plurality of memory cells from each other. The interlayer insulating layer 21 may include an oxide layer. Also, the gate electrode conductive layer 22 may include a polysilicon layer.

Also, the interlayer insulating layer 21 and the gate electrode conductive layer 22 may be formed repeatedly according to the number of memory cells to be stacked on the substrate 20. For illustration purposes, the present embodiment illustrates the case of stacking two memory cells.

The interlayer insulating layers 21 and the gate electrode conductive layers 22 are etched to form a channel trench exposing the surface of the substrate 20.

A charge blocking layer, a charge trapping layer, and a tunnel insulating layer are sequentially formed over the resulting structure including the channel trench, and an etch-back process is performed to expose the surface of the substrate 20. For illustration purposes, the charge blocking layer, the charge trapping layer, and the tunnel insulating layer are illustrated as one layer denoted by a reference numeral 23.

An undoped first channel layer 24 is formed over the resulting structure including the charge blocking layer, the charge trapping layer, and the tunnel insulating layer. Herein, the first channel layer 24 is formed such that a center region of the channel trench is hollow.

A plasma doping process is performed to dope the first channel layer 24 with impurities. For example, a first channel layer 24 may include an undoped polysilicon layer, and the first channel layer 24 may be doped with n-type impurities.

Through the plasma doping process, the first channel layer 24 is doped with impurities to a certain thickness from the surface of the first channel layer 24. Herein, the doping concentration is highest at the surface of the first channel layer 24, and decreases with an increase in depth from the surface of the first channel layer 24.

Referring to FIG. 2B, a heavily-doped region of the first channel layer 24 is etched to a predetermined thickness. That is, the first channel layer 24 is etched to a predetermined thickness from the surface of the first channel layer 24 to remove the high-concentration impurities of the first channel layer 24, thereby leaving only the low-concentration impurities of the first channel layer 24A. The first channel layer 24 etched to the predetermined thickness is denoted by a reference numeral 24A.

A second channel layer 25 is formed on the resulting structure to fill the channel trench. The second channel layer 25 may include an undoped polysilicon layer.

Referring to FIG. 2C, a planarization process is performed to expose the surface of the interlayer insulating layer 21, thereby forming a channel CH including a first channel layer 24B and a second channel layer 25A.

A thermal treatment process is performed to diffuse the doped impurities of the first channel layer 24B into the second channel layer 25A, thereby forming a channel CH with a low doping concentration.

FIGS. 3A to 3D are cross-sectional views illustrating a process for fabricating a 3D nonvolatile memory device in accordance with another embodiment of the present invention. A description of an overlap with the embodiment of FIGS. 2A to 2C will be omitted.

Figure 3A:
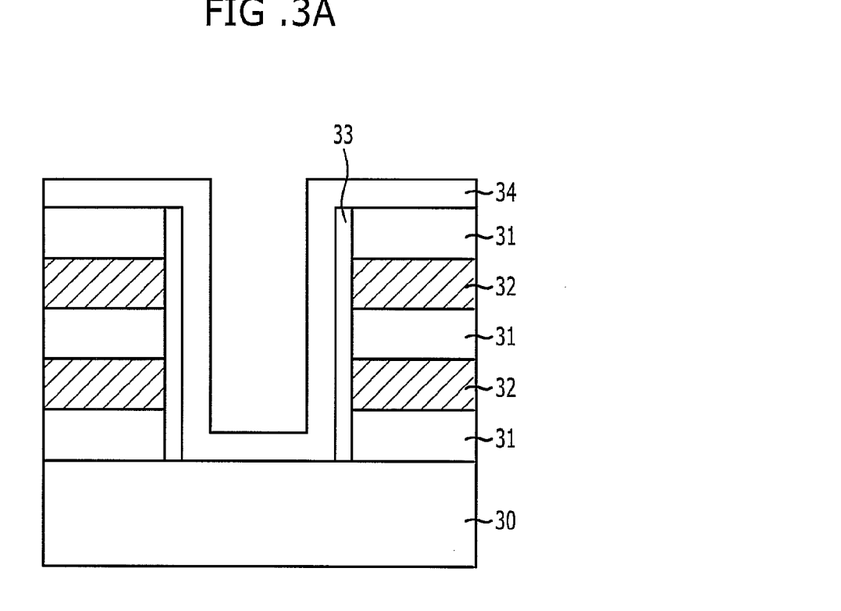
FIGS. 3A to 3D are cross-sectional views illustrating a process for fabricating a 3D nonvolatile memory device in accordance with another embodiment of the present invention.

Referring to FIG. 3A, a plurality of interlayer insulating layers 31 and a plurality of gate electrode conductive layers 32 are alternately formed on a substrate 30. The interlayer insulating layers 31 and the gate electrode conductive layers 32 are etched to form a channel trench exposing the surface of the substrate 30.

A charge blocking layer, a charge trapping layer, and a tunnel insulating layer are sequentially formed over the resulting structure including the channel trench, and an etch-back process is performed to expose the surface of the substrate 30. For illustration purposes, the charge blocking layer, the charge trapping layer, and the tunnel insulating layer are illustrated as one layer denoted by a reference numeral 33.

A first channel layer 34 is formed over the resulting structure including the charge blocking layer, the charge trapping layer, and the tunnel insulating layer 33. For example, the first channel layer 34 may include an undoped polysilicon layer.

Figure 3B:
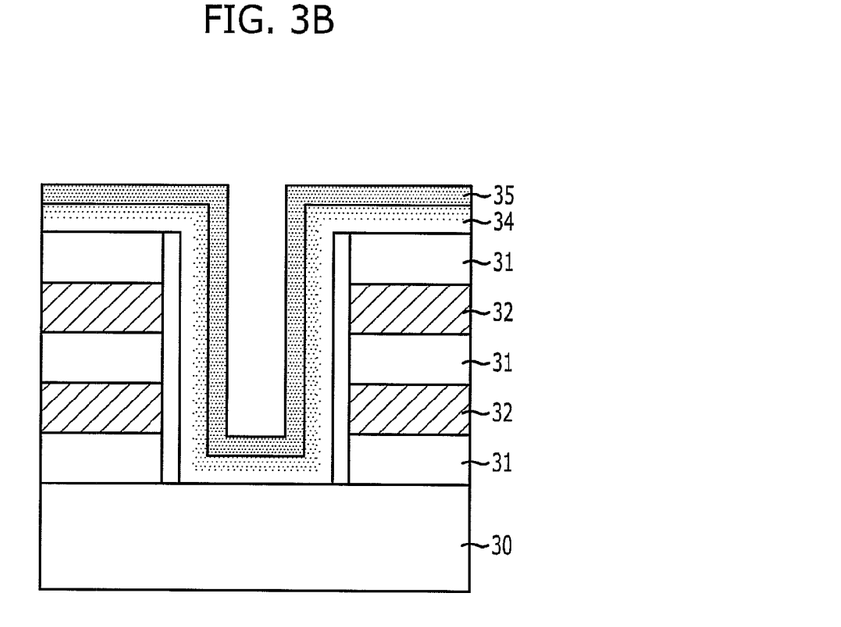

Referring to FIG. 3B, a buffer layer 35 is formed on the first channel layer 34. Herein, the buffer layer 35 serves to prevent the first channel layer 34 from being directly doped with impurities in the subsequent process. The buffer layer 35 may include an oxide layer or a nitride layer. For example, if the buffer layer 35 is an oxide layer, an oxide layer may be deposited on the first channel layer 34 or the surface of the first channel layer 34 may be oxidized to a predetermined thickness through an oxidation process to form the buffer layer 35.

A plasma doping process is performed to dope the first channel layer 34 with impurities. The buffer layer 35 on the first channel layer 34 is doped with impurities, and then the first channel layer 34 is doped with impurities. The buffer layer 35 can prevent the first channel layer 34 from being directly doped with impurities. Thus, the buffer layer 35 is doped at a relatively high doping concentration, and the first channel layer 34 is doped at a relatively low doping concentration.

The thickness of the buffer layer 35 may be controlled to control the doping concentration of the first channel layer 34. For example, the doping concentration of the first channel layer 34 may be reduced by increasing the thickness of the buffer layer 35.

Figure 3C:
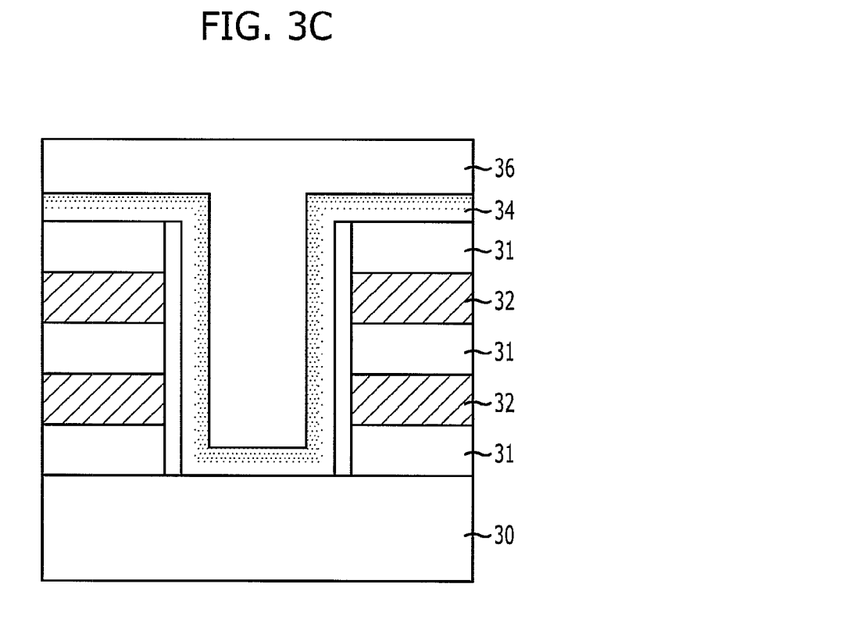

Referring to FIG. 3C, the buffer layer 35 is removed to remove the heavily-doped region. The buffer layer 35 may be removed through a wet etching process.

A second channel layer 36 is formed over the resulting structure without the buffer layer 35. The second channel layer 36 may include an undoped polysilicon layer.

Figure 3D:
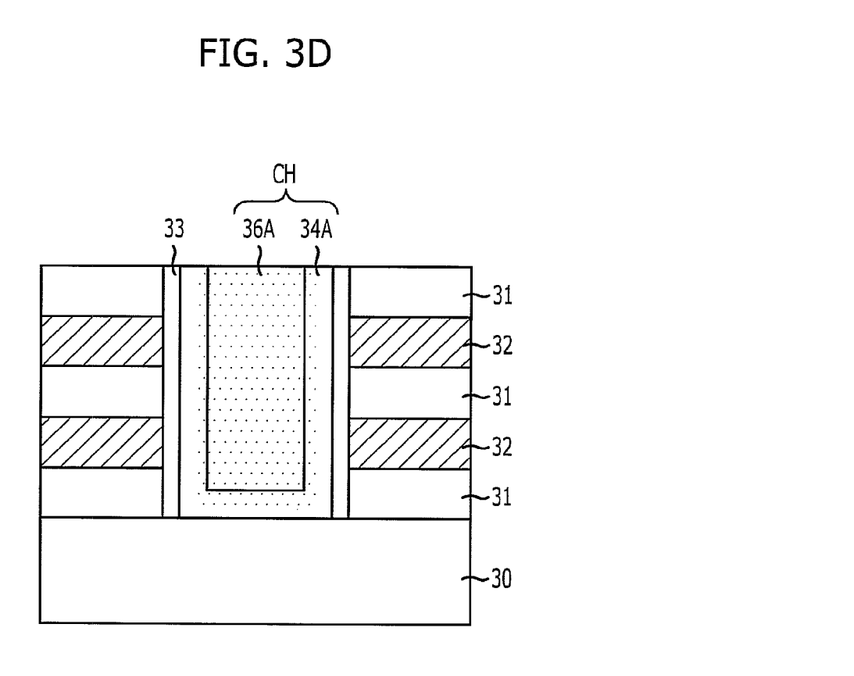

Referring to FIG. 3D, a planarization process is performed to expose the surface of the interlayer insulating layer 31, thereby forming a channel CH including a first channel layer 34A and a second channel layer 36A.

A thermal treatment process is performed to diffuse the doped impurities of the first channel layer 34A into the second channel layer 36A, thereby forming a channel CH with a low doping concentration.

FIGS. 4A to 4D are cross-sectional views illustrating a process for fabricating a 3D nonvolatile memory device in accordance with another embodiment of the present invention. A detailed description of the process that overlaps with the description of the foregoing embodiments will be omitted.

Figure 4A:
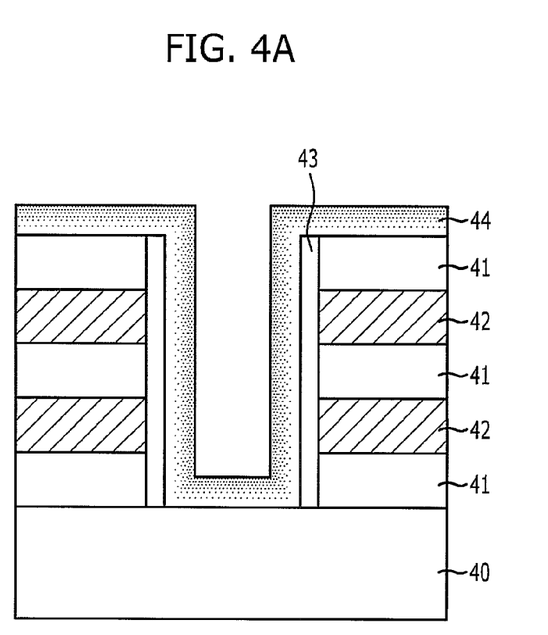
FIGS. 4A to 4D are cross-sectional views illustrating a process for fabricating a 3D nonvolatile memory device in accordance with another embodiment of the present invention.

Referring to FIG. 4A, a plurality of interlayer insulating layers 41 and a plurality of gate electrode conductive layers 42 are alternately formed on a substrate 40. The interlayer insulating layers 41 and the gate electrode conductive layers 42 are etched to form a channel trench exposing the surface of the substrate 40.

A charge blocking layer, a charge trapping layer, and a tunnel insulating layer are sequentially formed over the resulting structure including the channel trench, and an etch-back process is performed to expose the surface of the substrate 40. For illustration purposes, the charge blocking layer, the charge trapping layer, and the tunnel insulating layer are illustrated as one layer denoted by a reference numeral 43.

A first channel layer 44 is formed over the resulting structure including the charge blocking layer, the charge trapping layer, and the tunnel insulating layer. The first channel layer 44 may include an undoped polysilicon layer.

A plasma doping process is performed to dope the first channel layer 44 with impurities. A first channel layer 44 may include an undoped polysilicon layer, and the first channel layer 44 may be doped with n-type impurities. The doping concentration is highest at the surface of the first channel layer 44, and decreases with an increase in depth from the surface of the first channel layer 44.

Figure 4B:
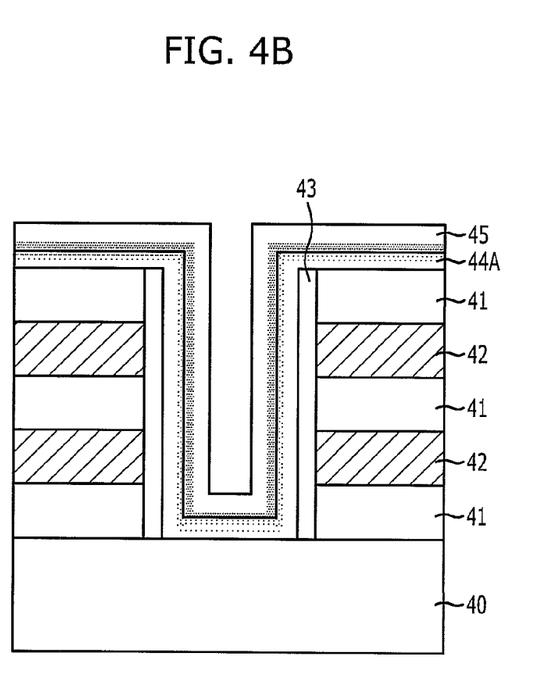

Referring to FIG. 4B, a buffer layer 45 is formed on the first channel layer 44. The buffer layer 45 serves to remove the heavily-doped region of the first channel layer 44. The buffer layer 45 may include an oxide layer or a nitride layer.

For example, if the buffer layer 45 is an oxide layer, the surface of the first channel layer 44 may be oxidized to a predetermined thickness through an oxidation process to form an oxide layer. At this point, the surface of the first channel layer 44 with a high doping concentration is oxidized to form the oxide layer, i.e., the buffer layer 45.

The buffer layer 45 formed through the oxidation process is removed in the subsequent process, thereby removing the heavily-doped region. Thus, the remaining doping concentration of the first channel layer 44 may be controlled by controlling the oxidation level of the first channel layer 44, i.e., the thickness of the buffer layer 45. For example, the remaining doping concentration of the first channel layer 44 may be reduced by increasing the oxidation thickness of the first channel layer 44, i.e., by increasing the thickness of the buffer layer 45.

Figure 4C:
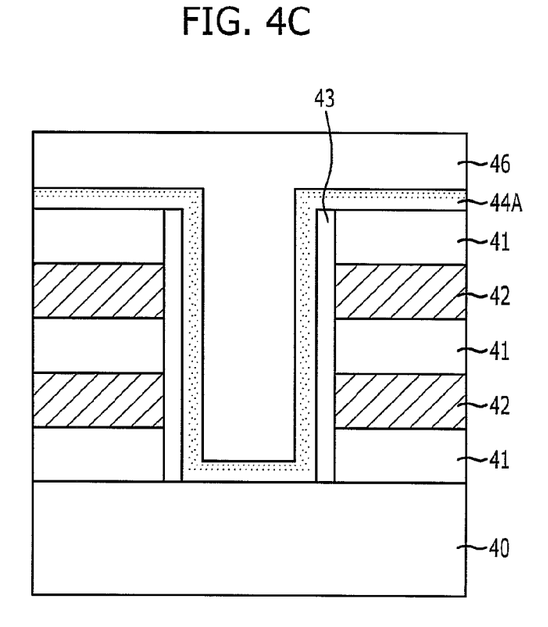

Referring to FIG. 4C, the buffer layer 45 is removed. The buffer layer 45 may be removed through a wet etching process.

In this way, the impurities of the surface of the first channel layer 44 heavily doped through the plasma doping process can be removed by removing the buffer layer 45 formed by oxidizing the surface of the first channel layer 44. Accordingly, the heavily-doped region is removed and only the lightly-doped region remains in a first channel layer 44A.

A second channel layer 46 is formed over the resulting structure without the buffer layer 45. The second channel layer 46 may include an undoped polysilicon layer.

Figure 4D:
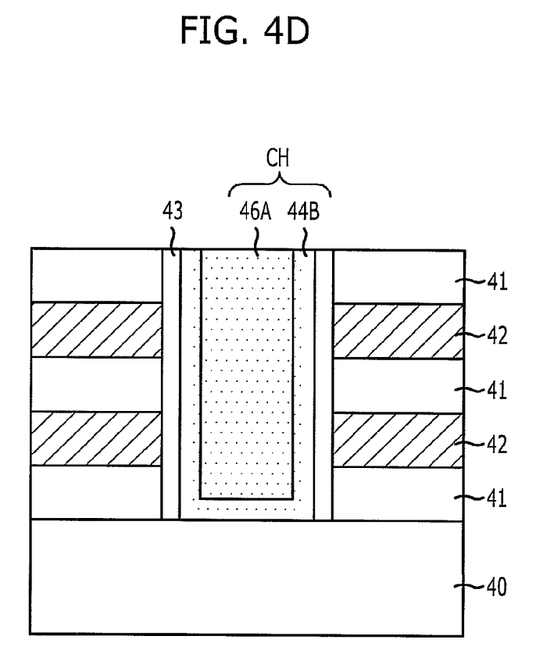

Referring to FIG. 4D, a planarization process is performed to expose the surface of the interlayer insulating layer 41, thereby forming a channel CH including a first channel layer 44A and a second channel layer 46A.

A thermal treatment process is performed to diffuse the doped impurities of the first channel layer 44B into the second channel layer 46A, thereby forming a channel CH with a low doping concentration.

Figure 5A:
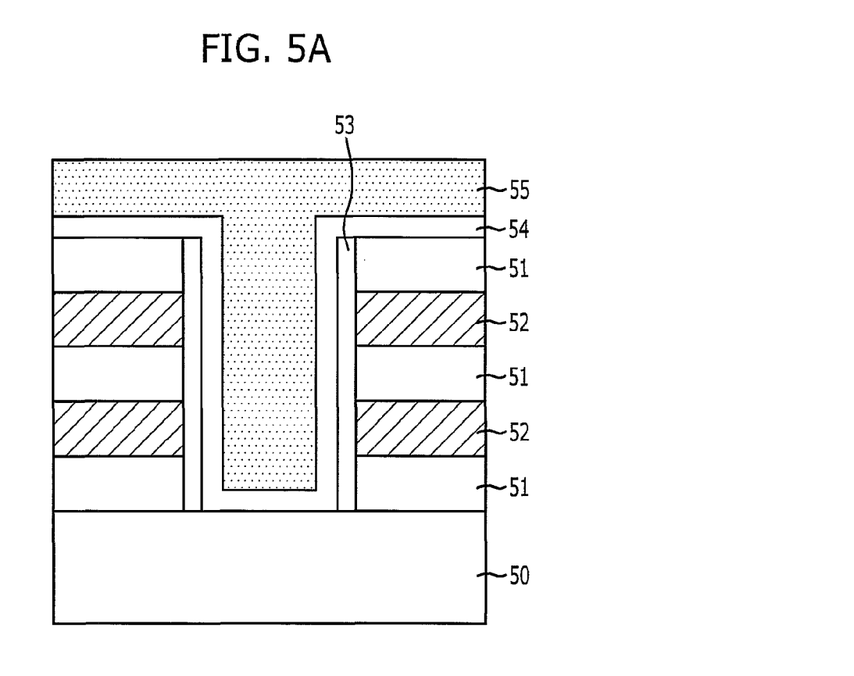
FIGS. 5A and 5B are cross-sectional views illustrating a process for fabricating a 3D nonvolatile memory device in accordance with another embodiment of the present invention.
Figure 5B:
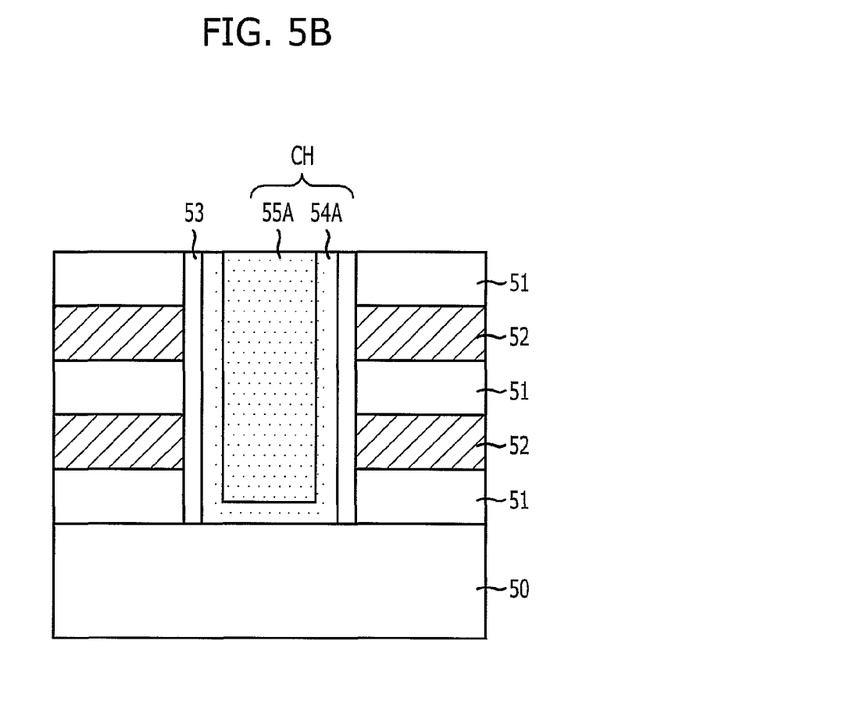

FIGS. 5A and 5B are cross-sectional views illustrating a process for fabricating a 3D nonvolatile memory device in accordance with another embodiment of the present invention. A detailed description that overlaps with the description of the foregoing embodiments of the present invention will be omitted.

Referring to FIG. 5A, a plurality of interlayer insulating layers 51 and a plurality of gate electrode conductive layers 52 are alternately formed on a substrate 50. The interlayer insulating layers 51 and the gate electrode conductive layers 52 are etched to form a channel trench exposing the surface of the substrate 50.

A charge blocking layer, a charge trapping layer, and a tunnel insulating layer 53 are sequentially formed over the resulting structure including the channel trench, and an etch-back process is performed to expose the surface of the substrate 50. For illustration purposes, the charge blocking layer, the charge trapping layer, and the tunnel insulating layer are illustrated as one layer denoted by a reference numeral 53.

A first channel layer and a second channel layer are alternately formed in the channel trench. The first channel layer and the second channel layer have different doping concentrations. The first channel layer has a relative low doping concentration and the second channel layer has a relatively high doping concentration. Hereinafter, a description is provided for an exemplary case where the first channel layer 54 is undoped and the second channel layer 55 is doped.

A first channel layer 54 is formed over the resulting structure including the charge blocking layer, the charge trapping layer, and the tunnel insulating layer.

A doped second channel layer 55 is formed on the resulting structure including the first channel layer 54. The second channel layer 55 may be formed through a doping process. More specifically, the second channel layer 55 may include a polysilicon layer doped with n-type impurities.

Referring to FIG. 5B, a thermal treatment process is performed to diffuse the doped impurities of the second channel layer 55 into the first channel layer 54.

A planarization process is performed to expose the surface of the interlayer insulating layer 51, thereby forming a lightly-doped channel CH including a first channel layer 54A and a second channel layer 55A.

Even if the present embodiment has been described an exemplary case of forming the channel including the first channel layer 54 and the second channel layer 55, a plurality of channel layers may also be repeatedly formed to form a multi-stack channel.

As described above, a first channel layer may be doped with impurities through a plasma doping process, and the heavily-doped region may be etched to a predetermined thickness, thereby making it possible to form a lightly-doped channel. In particular, a buffer layer is formed on the first channel layer and removed in the subsequent process, thereby making it possible to easily remove the heavily-doped region.

Also, the first and second channel layers are alternately formed with different doping concentrations, and a thermal treatment process is performed on the resulting structure, thereby making it possible to easily form a lightly-doped channel.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a vertical channel type nonvolatile memory device, comprising:
   stacking a plurality of interlayer insulating layers alternately with a plurality of conductive layers over a substrate;
   etching the interlayer insulating layers and the conductive layers to form a channel trench exposing the substrate;
   forming an undoped first channel layer over a resulting structure obtained from the etching of the interlayer insulating layers and the conductive layers, wherein the resulting structure includes the channel trench;
   doping the undoped first channel layer with impurities through a plasma doping process to form a doped first channel layer;
   etching the doped first channel layer to a predetermined thickness;
   filling the channel trench with a second channel layer after the etching of the first doped channel layer,
   performing a planarization process to expose an upper surface of the uppermost interlayer insluting layer among the plurality of interlayer insulating layers: and
   diffusing the impurities from the doped first channel layer into the second channel layer after the performing of the planarization process.

2. The method of claim 1, wherein the diffusing of the impurities is performed by a thermal treatment process.

3. The method of clam 2, wherein the performance of the thermal treatment process includes diffusing the doped impurities of the doped first channel layer into the second channel layer.

4. The method of claim 1, further comprising:
   forming a charge blocking layer, a charge trap layer, and a tunnel insulating layer over the resulting structure including the channel trench before the forming of the undoped first channel layer.

5. The method of claim 1, wherein the conductive layers each form a gate electrode.

6. The method of claim 1, wherein the interlayer insulating layers each includes an oxide layer.

7. The method of claim 1, wherein the impurities of the doped first channel layer includes an N type impurity.

8. The method of claim 1, wherein the doped first channel layer that remains after the etching of the doped first channel layer to the predetermined thickness has a lower concentration than an impurity concentration of the first channel layer removed from the etching.

9. The method of claim 1, wherein the second channel layer includes an undoped polysilicon layer.

10. A method for fabricating a vertical channel type nonvolatile memory device, the method comprising:
    stacking a plurality of interlayer insulating layers alternately with a plurality of conductive layers over a substrate;
    etching the interlayer insulating layers and the conductive layers to form a channel trench exposing the substrate;
    forming an undoped first channel layer on the channel trench;
    doping the undoped first channel layer with impurities to form a doped first channel layer;
    etching the doped first channel layer to a predetermined thickness;
    filling the channel trench with an undoped second channel layer after the etching of the doped first channel layer;
    performing a planarization process to expose an upper surface of the uppermost interlayer insulating layer among the plurality of interlayer insulating layers: and
    diffusing, after the performing of the planarization process, the impurities from the doped first channel layer to the undoped second channel layer to form a channel with a low doping concentration.

11. The method of claim 10, further comprising:
    forming a charge blocking layer, a charge trap layer, and a tunnel insulating layer over a resulting structure from etching the interlayer insulating layers and the conductive layer, wherein the resulting structure includes the channel trench formed before the forming of the undoped first channel layer.

12. The method of claim 10, wherein the conductive layers each form a gate electrode.

13. The method of claim 10, wherein the undoped second channel layer includes an undoped polysilicon layer.

14. The method of claim 10, wherein the interlayer insulating layers each includes an oxide layer.

15. The method of claim 10, wherein the impurities of the doped first channel layer includes an N type impurity.

16. The method of claim 10, wherein the doped first channel layer has a lower concentration of impurities after etching of the doped first channel layer to the predetermined thickness.

* * * * *

UNITED STATES PATENT AND TRADEMARK OFFICE
CERTIFICATE OF CORRECTION

| | | |
|---|---|---|
| PATENT NO. | : 8,048,743 B2 | Page 1 of 1 |
| APPLICATION NO. | : 12/493439 | |
| DATED | : November 1, 2011 | |
| INVENTOR(S) | : Ki-Hong Lee et al. | |

It is certified that error appears in the above-identified patent and that said Letters Patent is hereby corrected as shown below:

Title Page, change FOREIGN PATENT DOCUMENTS portion of section (56) for References Cited as follows:

FOREIGN PATENT DOCUMENTS

| | | |
|---|---|---|
| JP | 54008981 A * | 1/1979 |
| JP | 2008-192708 | 8/2008 |
| KR | 1020070046350 | 5/2007 |
| KR | 1020070069912 | 7/2007 |

Signed and Sealed this
Third Day of January, 2012

David J. Kappos
*Director of the United States Patent and Trademark Office*